United States Patent
Hisamatsu et al.

(10) Patent No.: US 9,524,876 B2
(45) Date of Patent: Dec. 20, 2016

(54) PLASMA ETCHING METHOD AND PLASMA ETCHING APPARATUS

(71) Applicant: TOKYO ELECTRON LIMITED, Tokyo (JP)

(72) Inventors: Toru Hisamatsu, Miyagi (JP); Masanobu Honda, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 14/710,695

(22) Filed: May 13, 2015

(65) Prior Publication Data
US 2015/0332929 A1   Nov. 19, 2015

(30) Foreign Application Priority Data

May 15, 2014  (JP) ................. 2014-101376

(51) Int. Cl.
  *H01L 21/311* (2006.01)
  *H01L 21/3065* (2006.01)
  *H01L 21/02* (2006.01)
  *H01L 21/308* (2006.01)
  *H01L 21/67* (2006.01)

(52) U.S. Cl.
  CPC ..... *H01L 21/3065* (2013.01); *H01L 21/02167* (2013.01); *H01L 21/02274* (2013.01); *H01L 21/3081* (2013.01); *H01L 21/3086* (2013.01); *H01L 21/67069* (2013.01)

(58) Field of Classification Search
  CPC .......... H01L 21/3065; H01L 21/02167; H01L 21/3081; H01L 21/3086

USPC ............ 216/37, 67; 438/692, 694, 703, 710
See application file for complete search history.

(56) References Cited

U.S. PATENT DOCUMENTS

| 2005/0103748 A1* | 5/2005 | Yamaguchi ....... H01L 21/31116 216/67 |
| 2008/0038926 A1* | 2/2008 | Ventzek ........... H01J 37/32027 438/706 |
| 2008/0087639 A1* | 4/2008 | Adams ................ H01L 21/0212 216/58 |

FOREIGN PATENT DOCUMENTS

| JP | 2010-516059 A | 5/2010 |
| WO | 2014/024833 A1 | 2/2014 |

* cited by examiner

*Primary Examiner* — Duy Deo
*Assistant Examiner* — Maki Angadi
(74) *Attorney, Agent, or Firm* — Rothwell, Figg, Ernst & Manbeck, P.C.

(57) ABSTRACT

Disclosed is a plasma etching method including a deposition process and an etching process. For a processing target object including a base layer and a photoresist having a predetermined pattern which are laminated in sequence, the deposition process deposits a protective layer including silicon and carbon on the photoresist of the processing target object by plasma of a first processing gas including silicon tetrachloride gas, methane gas, and hydrogen gas. The etching process etches the base layer by plasma of a second processing gas using the photoresist including the protective layer deposited thereon, as a mask. The second processing gas is different from the first processing gas.

4 Claims, 8 Drawing Sheets

| | Initial | Coat | Coat+DCS |
|---|---|---|---|
| Cross Section | | | |
| L-CD/PR Remain | 37.3nm/90.2nm | 45.1nm/125.8nm | 46.9nm/122.9nm |
| Top Face | | | |
| LWR/LES/SWR/SUM | 4.0/2.6/4.1/10.7 | 3.2/2.0/2.6/7.7 | 3.2/2.0/2.5/7.7 |
| | Initial+SiARC | Coat+SiARC | Coat+DCS+SiARC |
| Cross Section | | | |
| L-CD/PR Remain | 37.3nm/90.2nm | 47.8nm/88.4nm | 44.8nm/86.7nm |
| Top Face | | | |
| LWR/LES/SWR/SUM | 4.0/2.6/4.1/10.7 | 2.9/1.8/2.8/7.5 | 2.6/1.6/2.3/6.6 |

FIG.7

| | H2:0sccm | H2:100sccm | H2:200sccm |
|---|---|---|---|
| Cross Section | | | |
| L-CD/PR Remain | 43.8nm/124.0nm | 45.1nm/125.8nm | 53.5nm/127.7nm |
| Top Face | | | |
| LWR/LES/SWR/SUM | 3.1/1.7/2.4/7.2 | 3.2/2.0/2.6/7.7 | 3.7/2.1/2.6/8.4 |

FIG.8

| | SiCl4/CH4=50/0 | SiCl4/CH4=50/20 | SiCl4/CH4=20/50 | SiCl4/CH4=0/50 |
|---|---|---|---|---|
| Cross Section | | | | |
| L-CD/PR Remain | 40.9nm/76.2nm | 45.1nm/125.8nm | 55.5nm/138.7nm | 37.7nm/81.2nm |
| Top Face | | | | |
| LWR/LES/SWR/SUM | 2.7/1.8/2.6/7.1 | 3.2/2.0/2.6/7.7 | 3.8/2.2/2.6/8.5 | 5.6/4.9/8.7/19.3 |

PLASMA ETCHING METHOD AND PLASMA ETCHING APPARATUS

CROSS-REFERENCE TO RELATED APPLICATIONS

This application is based on and claims priority from Japanese Patent Application No. 2014-101376, filed on May 15, 2014, with the Japan Patent Office, the disclosure of which is incorporated herein in its entirety by reference.

TECHNICAL FIELD

Various aspects and exemplary embodiments of the present disclosure relate to a plasma etching method and a plasma etching apparatus.

BACKGROUND

In the related art, a plasma etching apparatus performs etching using a photoresist as a mask. Here, there is a method for improving characteristics of the photoresist that is used as a mask by the plasma etching apparatus. For example, there is a method for depositing silicon containing deposits as a protective layer on the photoresist by plasma of at least any one of silicon tetrachloride gas and methane gas. See, for example, Japanese National Phase Patent Laid-Open Publication No. 2010-516059 and International Publication No. WO2014/024833.

SUMMARY

A plasma etching method according to an aspect of the present disclosure includes a deposition process and an etching process. With respect to a processing target object including a base layer and a photoresist having a predetermined pattern which are laminated in sequence, the deposition process deposits a protective layer including silicon and carbon on the photoresist of the processing target object by plasma of a first processing gas including silicon tetrachloride gas, methane gas, and hydrogen gas. The etching process etches the base layer by plasma of a second processing gas using the photoresist including the protective layer deposited thereon, as a mask. The second processing gas is different from the first processing gas.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

The related art described above suffers from difficulties in suppressing roughening of a line formed by etching and maintaining the height of the photoresist remaining after etching. Therefore, what is requested is to compatibly achieve the roughening of the line and the maintaining of the height of the photoresist.

A plasma etching method according to an aspect of the present disclosure includes a deposition process and an etching process. For a processing target object including a base layer and a photoresist having a predetermined pattern which are laminated in sequence, the deposition process deposits a protective layer including silicon and carbon on the photoresist of the processing target object by plasma of a first processing gas including silicon tetrachloride gas, methane gas, and hydrogen gas. The etching process etches the base layer by plasma of a second processing gas using the photoresist including the protective layer deposited thereon, as a mask. The second processing gas is different from the first processing gas.

In one exemplary embodiment, the plasma etching method, no bias voltage is applied to the processing target object in the deposition process.

In one exemplary embodiment, the plasma etching method further includes, after the deposition of the protective layer on the photoresist, a curing process of curing the protective layer by plasma of a third processing gas including hydrogen gas and an inert gas in a state where a negative direct current (DC) voltage is applied to an upper electrode disposed to face the processing target object and containing silicon. The etching process includes etching the base layer by plasma of the second processing gas using the photoresist including the protective layer deposited and cured thereon, as a mask.

A plasma etching apparatus according another aspect of the present disclosure includes: a chamber configured to perform a plasma etching processing on a processing target object; an exhaust unit configured to decompress an interior of the chamber; a gas supply unit configured to supply a processing gas to the interior of the chamber; and a control unit configured to execute respective processes of: depositing a protective layer including silicon and carbon on a photoresist of the processing target object by plasma of a first processing gas including silicon tetrachloride gas, methane gas, and hydrogen gas, in which the processing target object includes a base layer and the photoresist having a predetermined pattern which are laminated in sequence; and etching the base layer by plasma of a second processing gas using the photoresist including the protective layer deposited thereon, as a mask. The second processing gas is different from the first processing gas.

According to various aspects and exemplary embodiments of the present disclosure, a plasma etching method and a plasma etching apparatus, which are capable of suppressing roughening of a line formed by etching and maintaining the height of a photoresist remaining after etching, are realized.

Hereinafter, various exemplary embodiments will be described in detail with reference to the accompanying drawings. In addition, in the respective drawings, the same or corresponding components will be given the same reference numerals.

(Plasma Etching Apparatus According to First Exemplary Embodiment)

Figure 1:
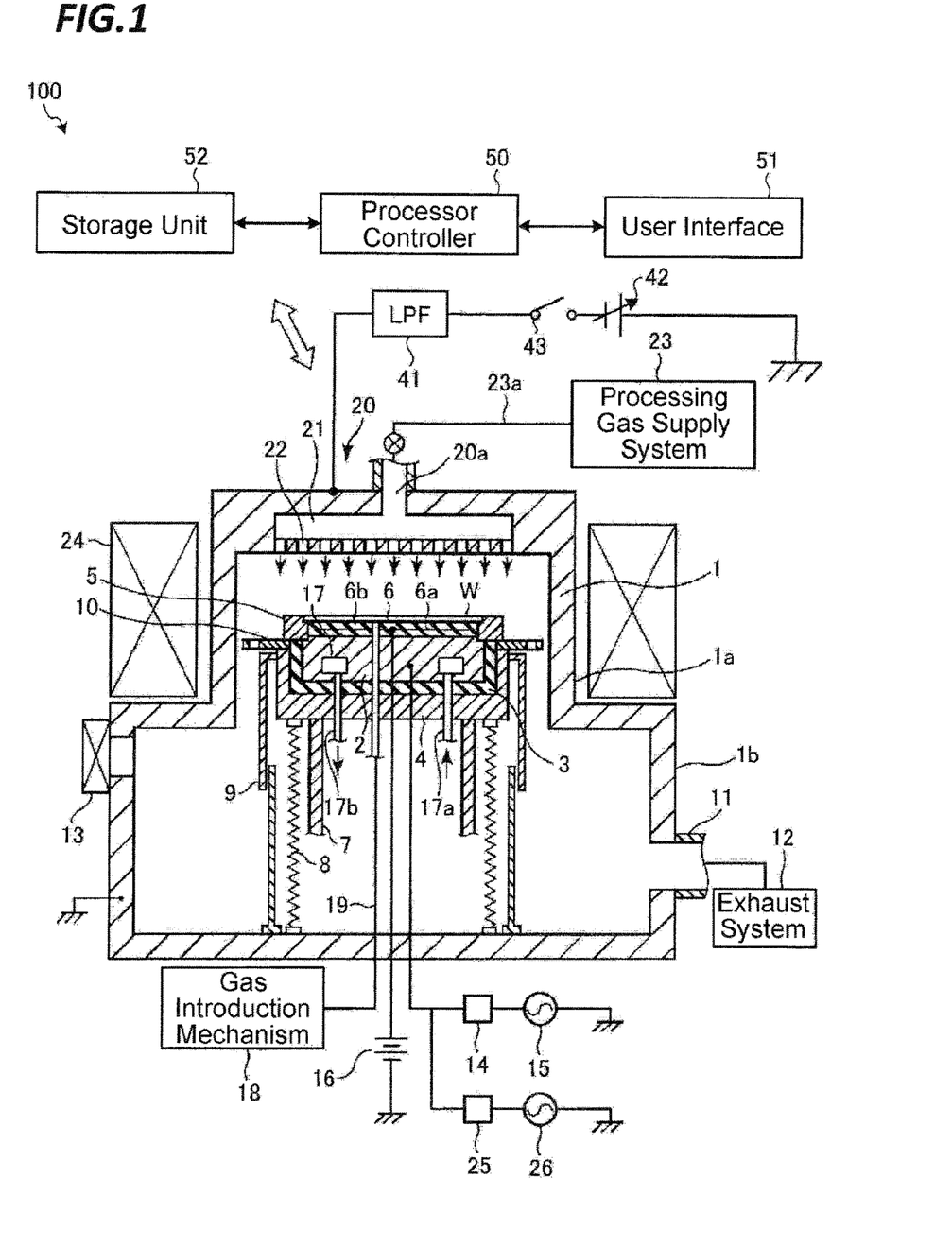
FIG. 1 is a sectional view illustrating an exemplary plasma etching apparatus according to a first exemplary embodiment.

FIG. 1 is a sectional view illustrating an exemplary plasma etching apparatus according to a first exemplary embodiment. In the exemplary embodiment illustrated in FIG. 1, a parallel flat plate type plasma etching apparatus is illustrated as a plasma etching apparatus 100. As illustrated in FIG. 1, the plasma etching apparatus 100 includes a chamber (processing container) 1. The chamber (processing container) 1 is hermetically configured and has a stepped cylindrical shape including an upper portion 1a with a small diameter and a lower portion 1b with a large diameter. A wall portion of the chamber is formed of, for example, aluminum.

A support table 2 is provided in the chamber 1 to horizontally support a wafer W as a processing target object. The support table 2 is formed of, for example, aluminum, and supported on a conductive support member 4 via an insulation plate 3. In addition, a focus ring 5, formed of, for example, Si, is provided on the outer circumference of the support table 2. The support table 2 and the support member 4 are configured to be movable upward and downward by a ball screw mechanism including ball screws 7. A drive section below the support member 4 is covered with a bellows 8 formed of stainless steel (SUS). A bellows cover 9 is provided outside the bellows 8. In addition, a baffle plate 10 is provided outside the focus ring 5. The focus ring 5 is electrically connected to the chamber 1 through the baffle plate 10, the support member 4, and the bellows 8. The chamber 1 is grounded.

The chamber 1 is formed with an exhaust port 11 in the sidewall of the lower portion 1b and an exhaust system 12 is connected to the exhaust port 11. The inside of the chamber 1 may be decompressed to a predetermined vacuum degree by operating a vacuum pump of the exhaust system 12. Meanwhile, a gate valve 13 is provided at the upper side of the sidewall of the lower portion 1b of the chamber 1 to open or close a carry-in/carry-out opening for the wafer W. The exhaust system 12 is also called a "decompressing unit."

A first high frequency power source 15 for plasma generation is connected to the support table 2 through a matcher 14, and a high frequency power of a predetermined frequency is supplied from the first high frequency power source 15 to the supporting table 2. A shower head 20 to be described below is arranged above the support table 2 to face and be in parallel with the support table 2. The shower head 20 is placed to face the wafer W on the support table 2 and defines a surface which is in contact with a plasma generation space, i.e. a facing surface. The shower head 20 is grounded. The support table 2 and the shower head 20 function as a pair of electrodes. Therefore, in the following description, the support table 2 is also called a "lower electrode" and the shower head 20 is also called an "upper electrode."

A variable direct current (DC) power source 42 is electrically connected to the shower head 20 through a low pass filter (LPF) 41. The variable DC power source 42 enables ON/OFF of power supply by an ON/OFF switch 43. The current/voltage of the variable DC power source 42 and the ON/OFF of the ON/OFF switch 43 are controlled by a process controller 50 to be described below. When plasma is generated in the chamber 1, the ON/OFF switch 43 is turned ON by the process controller 50 as needed so that a predetermined negative DC voltage is applied to the shower head 20 serving as the upper electrode.

A second high frequency power source 26 is connected to a power supply line of the first high frequency power source 15 through a matcher 25. The second high frequency power source 26 is configured to supply a high frequency power having a frequency lower than the frequency of the first high frequency power source 15 to overlap with the high frequency power for plasma generation.

An electrostatic chuck 6 is provided on the surface of the support table 2 to electrostatically attract and hold the wafer W. The electrostatic chuck 6 has a configuration in which an electrode 6a is interposed between insulators 6b, and a DC power source 16 is connected to the electrode 6a. Then, as a voltage is applied from the DC power source 16 to the electrode 6a, the wafer W is attracted by electrostatic force, for example, Coulomb force.

A coolant chamber 17 is provided in the support table 2. The coolant is introduced into the coolant chamber 17 through a coolant introduction pipe 17a and discharged from a coolant discharge pipe 17b to be circulated. Thus, the cold heat of the coolant is transferred to the wafer W through the support table 2. As such, the processing target surface of the wafer W is controlled to a desired temperature.

In addition, in order to allow the wafer W to be efficiently cooled by the coolant circulating in the coolant chamber 17 even when the chamber 1 is evacuated by the exhaust system 12 to be kept at the vacuum, a cooling gas is introduced between the front surface of the electrostatic chuck 6 and the rear surface of the wafer W through a gas supply line 19 via a gas introduction mechanism 18. As the cooling gas is introduced in this manner, the cold heat of the coolant is efficiently transferred to the wafer W, which may increase the cooling efficiency of the wafer W. As for the cooling gas, for example, He may be used.

The shower head 20 is provided in a ceiling wall portion of the chamber 1 so as to face the support table 2. The shower head 20 is formed of a silicon containing material such as, for example, silicon. A plurality of gas outlet holes 22 is provided on the top surface the shower head 20 and a gas inlet 20a is provided on the top portion of the shower head 20. In addition, the shower head 20 has a space 21 formed therein. A gas supply pipe 23a is connected to the gas inlet 20a and a processing gas supply system 23 is connected to the other end of the gas supply pipe 23a to supply a processing gas formed of an etching gas and a dilution gas. The processing gas supply system 23 is called a "gas supply unit."

The processing gas reaches the space 21 of the shower head 20 from the processing gas supply system 23 through the gas supply pipe 23a and the gas inlet 20a, thereby being ejected from the gas outlet holes 22.

A multi-pole magnet 24 is concentrically arranged around the upper portion 1a of the chamber 1 so as to form a magnetic field around a processing space between the support table 2 and the shower head 20. The multi-pole magnet 24 is configured to be rotatable by a rotating mechanism (not illustrated).

Figure 2:
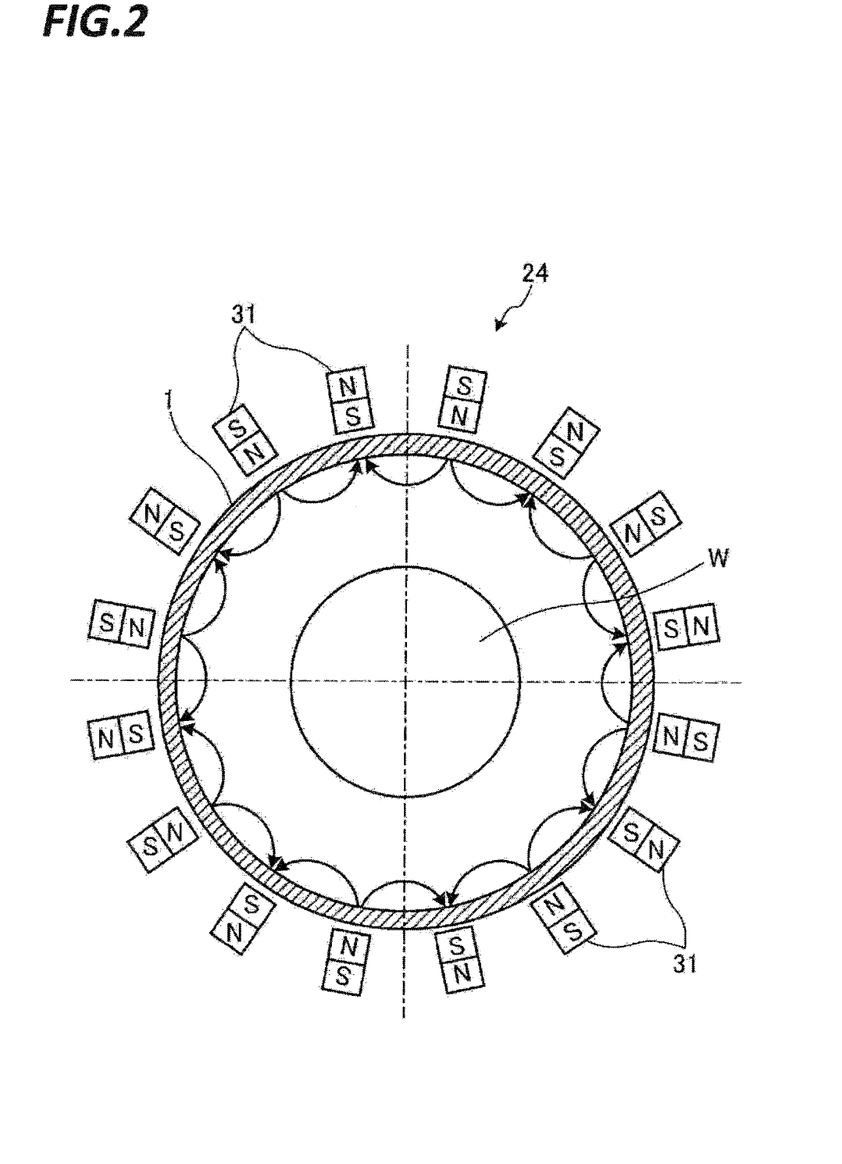
FIG. 2 is a horizontal sectional view schematically illustrating a multi-pole magnet arranged around a chamber of the plasma etching apparatus according to the first exemplary embodiment.

FIG. 2 is a horizontal sectional view schematically illustrating the multi-pole magnet arranged around the chamber of the plasma etching apparatus according to the first exemplary embodiment. The multi-pole magnet 24, as illustrated in the horizontal cross sectional view of FIG. 2, includes a plurality of segment magnets 31 formed of permanent magnets and arranged in a ring shape in a state where the segment magnets 31 are supported by a support member (not illustrated). In this exemplary embodiment, sixteen (16) segment magnets 31 are arranged in a ring (concentric circular) shape so as to provide multiple poles. That is, the multi-pole magnet 24 is configured such that the directions of magnetic poles of each two neighboring segment magnets 31 are reversed to each other. Thus, magnetic force lines are formed between the neighboring segment magnets 31 as illustrated. A magnetic field of, for example, 0.02 T to 0.2 T (200 Gauss to 2000 Gauss), preferably, 0.03 T to 0.045 T (300 Gauss to 450 Gauss) is formed only in a peripheral region of the processing space and a wafer mounting region becomes a substantially magnetic field-absent state. The strength of the magnetic field is defined as described above because an excessively strong magnetic field causes magnetic field leakage and an excessively weak magnetic field makes it impossible to achieve a plasma shield effect. However, since an appropriate magnetic field strength depends on, for example, an apparatus structure, the range of the magnetic field varies according to apparatuses. In addition, the substantially magnetic field-absent state includes not only a case where no magnetic field is present at all, but also a case where a magnetic field having an effect on an etching processing is not formed and a magnetic field substantially having no effect on a wafer processing is present in the wafer placing region. In addition, FIG. 2 is a horizontal sectional view schematically illustrating the multi-pole magnet 24 arranged around the chamber of the apparatus illustrated in FIG. 1.

In a state as illustrated in FIG. 2, a magnetic field having the magnetic flux density of, for example, 420 µT (4.2 Gauss) or less is applied around the wafer, thereby exerting a plasma shield function.

Figure 3A:
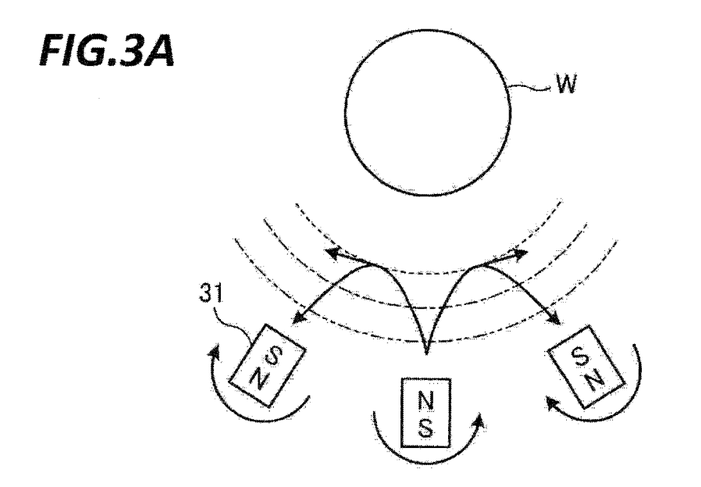
FIGS. 3A to 3C are views for describing rotation actions of segment magnets of the plasma etching apparatus and variation in a magnetic field during the rotation actions according to the first exemplary embodiment.
Figure 3B:
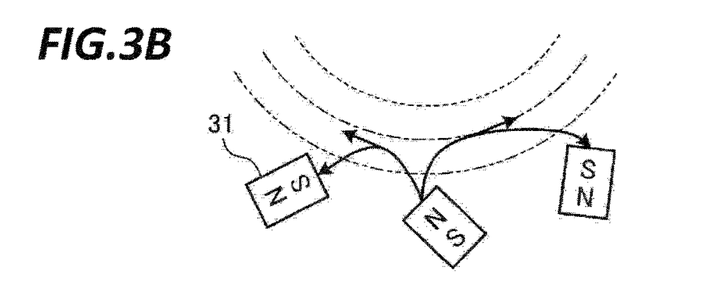
Figure 3C:
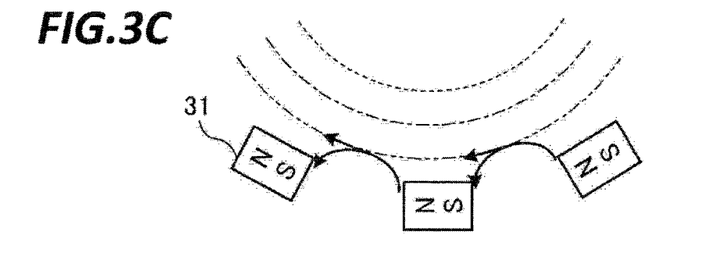

FIGS. 3A to 3C are views for describing rotating actions of the segment magnets of the plasma etching apparatus and variation in a magnetic field during the rotation according to the first exemplary embodiment. Each of the segment magnets 31 is configured to be rotatable about a vertical axis by a segment magnet rotating mechanism (not illustrated). For example, each two neighboring segment magnets 31 are synchronously rotated in reverse directions as illustrated in FIGS. 3A and 3C from a state where a magnetic pole of each segment magnet 31 is oriented toward the chamber 1 as illustrated in FIG. 2 and FIG. 3A. Thus, the segment magnets 31 are alternately rotated in the same direction. In addition, FIG. 3B illustrates a state where the segment magnets 31 are rotated by 45 degrees, and FIG. 3C illustrates a state where the segment magnets 31 are rotated by 45 degrees. When the segment magnets 31 are rotated as described above, switching is enabled between a state where a multi-pole magnetic field is formed and a state where a multi-pole magnetic field is not formed. Depending on a kind of film, the multi-pole magnetic field may act effectively or ineffectively. Thus, a proper etching condition may be selected depending on the film by making the state where the multi-pole magnetic field is formed and the state where the multi-pole magnetic field is not formed, switchable.

In addition, the respective components of the plasma etching apparatus 100 are connected to and controlled by the process controller 50 having a central processing unit (CPU). The process controller 50 is connected to a user interface 51 such as, for example, a keyboard on which a process manager performs, for example, an input operation of a command for managing the plasma etching apparatus 100, or a display that visualizes and displays an operating state of the plasma etching apparatus 100.

In addition, the process controller 50 is connected with a storage unit 52 which stores recipes in which, for example, control programs or processing condition data for implementing various processings in the plasma etching apparatus 100 via the control of the process controller 50 are written.

In addition, as any recipe is called from the storage unit 52 by, for example, an instruction from the user interface 51 and executed by the process controller 50, a desired processing may be performed in the plasma etching apparatus 100 under the control of the process controller 50. For example, the recipes may be used in a state they are stored in a computer readable recording medium such as, for example, a CD-ROM, a hard disk, a flexible disk, or a flash storage unit, or may be used by causing them to be frequently transmitted from other devices through, for example, an exclusive line. The process controller 50 is also called a "control unit."

For example, the process controller 50 controls the respective units of the plasma etching apparatus 100 to perform a plasma etching method as described below. Referring to a more detailed example, the process controller 50 deposits a protective layer, including silicon (Si) and carbon (C), on a photoresist of a processing target object by plasma of a first processing gas including silicon tetrachloride ($SiCl_4$) gas, methane ($CH_4$) gas, and hydrogen ($H_2$) gas. Then, the process controller 50 executes each process of etching a base layer by plasma of a second processing gas that is different from the first processing gas, using the photoresist having the deposited protective layer as a mask. Details of the plasma etching method will be described below. Here, the processing target object is, for example, the wafer W. In addition, the base layer is, for example, a silicon-containing anti-reflective coating (SiARC) layer.

Figure 4:
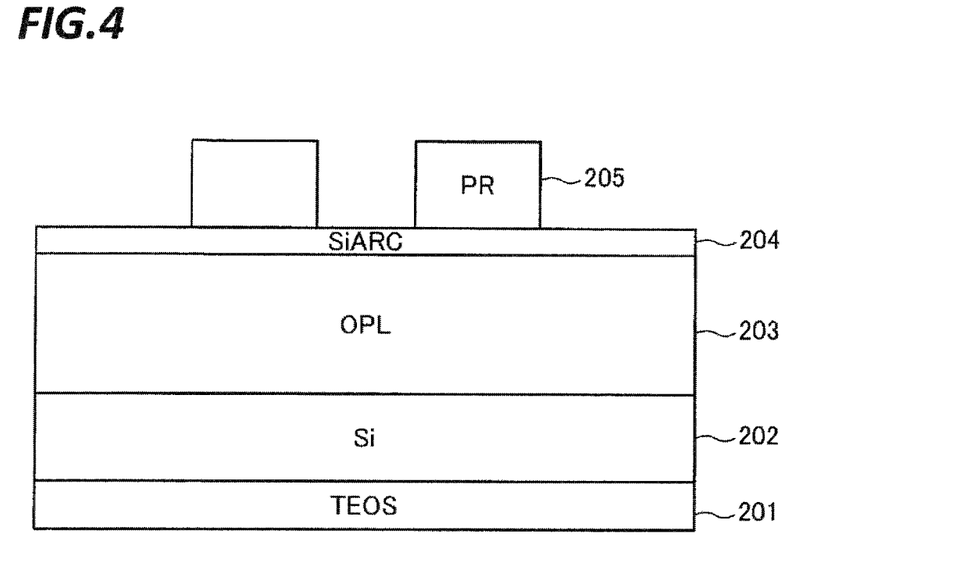
FIG. 4 is a sectional view illustrating an exemplary structure of a processing target object according to the first exemplary embodiment.

FIG. 4 is a sectional view illustrating an exemplary structure of the processing target object according to the first exemplary embodiment. In the example illustrated in FIG. 4, the processing target object includes, for example, a tetra-ethoxysilane (TEOS) layer 201, a Si (polysilicon) layer 202, an organic planarization layer (OPL) 203, and a SiARC layer 204 which are laminated in sequence. In addition, a photoresist (PR) 205 is formed on the SiARC layer 204. The SiARC layer 204 is one example of the base layer. In addition, the structure illustrated in FIG. 4 is given by way of example.

(Plasma Etching Method)

The plasma etching method according to the first exemplary embodiment includes plasma etching of a base layer using a photoresist having a predetermined pattern as a mask.

For example, first, the gate valve 13 is opened and the wafer W serving as a processing target object is carried into the chamber 1. After the wafer W is mounted on the support table 2, the support table 2 is raised to an illustrated position and the inside of the chamber 1 is evacuated through the exhaust port 11 by the vacuum pump of the exhaust system 12.

Then, for example, a processing gas including an etching gas and a dilution gas is introduced from the processing gas supply system 23 to the chamber 1 at a predetermined flow rate and the inside of the chamber 1 is set to a predetermined pressure. In this state, a predetermined high frequency power is supplied from the first high frequency power source 15 to the support table 2. At this time, as a predetermined voltage is applied to the electrode 6a of the electrostatic chuck 6 from the DC power source 16, the wafer W is attracted to and held by the electrostatic chuck 6 by Coulomb force. At this time, a high frequency electric field is formed between the shower head 20 serving as an upper electrode and the support table 2 serving as a lower electrode. In this way, the processing gas supplied to the processing space is turned into plasma such that plasma etching of the base layer is performed using the photoresist having a predetermined pattern as a mask as described in detail below.

In addition, at this time, the magnetic field as illustrated in FIG. 2 is formed around the processing space by the multi-pole magnet 24, which may exert a plasma shield effect to uniformize the etching rate of the wafer W.

In addition, the frequency and output of the first high frequency power source 15 for plasma generation are appropriately set to generate desired plasma. The frequency may be 40 MHz or higher in order to increase the plasma density immediately above the wafer W. In addition, the second high frequency power source 26 serves to supply a high frequency power for controlling the ionization energy of plasma and the frequency of the second high frequency power source 26 may be lower than the frequency of the first high frequency power source 15 and may be 3.2 MHz or higher.

In addition, in order to achieve good etching shape, adjusting the temperature of the wafer W is also effective. To this end, the coolant chamber 17 is provided, the coolant is circulated in the coolant chamber 17, and cold heat of the coolant is transferred to the wafer W through the support table 2. As a result, the processing target surface of the wafer W is controlled to a desired temperature. To achieve the good etching shape, i.e. a good anisotropy, the temperature of the wafer W may be adjusted in a range of, for example, about 30° C. to 90° C.

In addition, the kind and flow rate of a gas used for plasma etching may be selected to uniformize an etching shape. In addition, as exemplary ranges of other processing conditions, the gas pressure inside the chamber 1 is within a range of 0.13 Pa to 6.67 Pa (1 mTorr to 50 mTorr), the frequency of the first high frequency power source 15 MHz is 100 MHz, the frequency of the second high frequency power source 26 is 13 MHz, and the strength of a magnetic field in the processing space Rained by the multi-pole magnet 24 is within a range of 5.6 µT to 45.4 µT (56 G to 454 G). When these conditions are employed, the etching shape of the wafer W may be uniformized regardless a density difference in a mask pattern.

Figure 5:
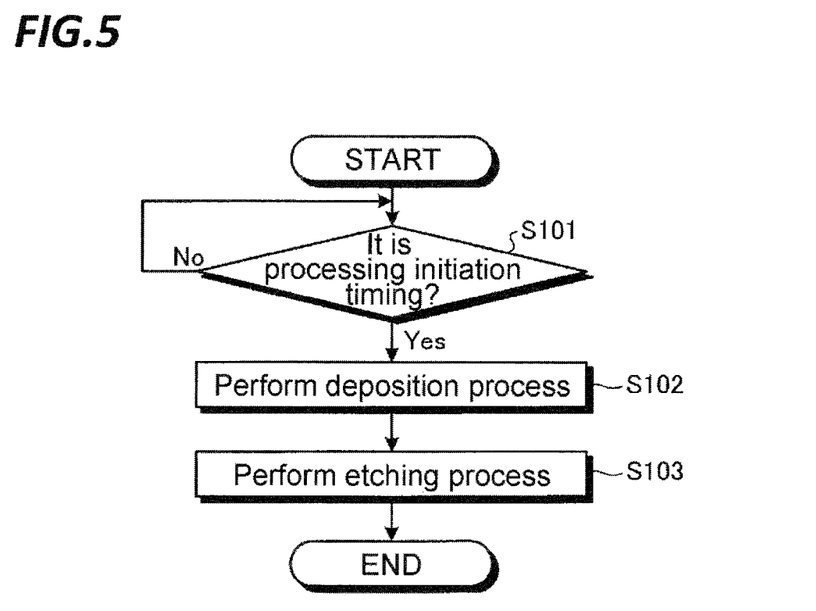
FIG. 5 is a view illustrating an exemplary flow of a plasma etching method according to the first exemplary embodiment.

The plasma etching method according to the first exemplary embodiment will be described below in more detail. FIG. 5 is a view illustrating an exemplary flow of a plasma etching method according to the first exemplary embodiment.

As illustrated in FIG. 5, when a processing initiation timing arrives (step S101; Yes), the plasma etching apparatus performs a deposition process of depositing a protective layer including Si and C on a photoresist of a processing target object by plasma of a first processing gas including $SiCl_4$ gas, $CH_4$ gas and $H_2$ gas (step S102). Specifically, the plasma etching apparatus supplies the first processing gas including $SiCl_4$ gas, $CH_4$ gas, and $H_2$ gas from the processing gas supply system 23 to the chamber 1 so as to generate plasma of the first processing gas, thereby depositing the protective layer including Si and C on the photoresist of the processing target object. At this time, the plasma etching apparatus applies no bias voltage to the processing target object. Here, the ratio of the flow rate of $CH_4$ to the sum of the flow rate of $SiCl_4$ gas and the flow rate of $CH_4$ gas may be greater than 0%, and may be 80% or less.

A more detailed example will be described. The process controller 50 of the plasma etching apparatus generates plasma from the first processing gas including $SiCl_4$ gas, $CH_4$ gas, and $H_2$ gas by introducing the first processing gas from the shower head 20 to the chamber 1, and supplying a high frequency power from the first high frequency power source 15. At this time, the process controller 50 stops the supply of a high frequency power from the second high frequency power source 26 so as not to apply the bias voltage to the processing target object. Then, H extracts Cl from $SiCl_4$ of the plasma, and Si falls toward the photoresist of the processing target object. In addition, a C-based reaction product generated from $CH_4$ gas falls toward the photoresist of the processing target object. Then, the protective layer including Si and C is deposited on the photoresist of the processing target object. As a result, the roughness of the surface of the photoresist is improved by the protective layer including Si and C, and the plasma resistance of the photoresist is also improved.

Subsequently, the plasma etching apparatus performs an etching process of etching the base layer by plasma of a second processing gas which is different from the first processing gas, using the photoresist having the deposited protective layer as a mask (step S103). Specifically, the plasma etching apparatus etches the base layer by supplying the second processing gas from the processing gas supply system 23 to the chamber 1 so as to generate plasma of the second processing gas. Here, the base layer is, for example, the SiARC layer 204 illustrated in FIG. 4. In addition, the second processing gas is, for example, $CF_4/CHF_3/O_2$ gas.

A more detailed example will be described. The process controller 50 of the plasma etching apparatus generates plasma from the second processing gas by introducing the second processing gas from the shower head 20 to the chamber 1 and supplying a high frequency power from the first high frequency power source 15. In addition, the process controller 50 introduces ions of plasma to the processing target object by supplying a high frequency power from the second high frequency power source 26. As a result, the base layer is etched.

As described above, according to the first exemplary embodiment, the protective layer including silicon (Si) and carbon (C) is deposited on the photoresist of the processing target object by the plasma of the first processing gas including silicon tetrachloride ($SiCl_4$) gas, methane ($CH_4$) gas, and hydrogen ($H_2$) gas, and the base layer is etched by the plasma of the second processing gas different from the first processing gas using the photoresist having the deposited protective layer as a mask. Therefore, according to the first exemplary embodiment, the roughness of the surface of the photoresist may be improved and the plasma resistance of the photoresist may be improved. As a result, according to the first exemplary embodiment, the roughening of a line formed by etching may be suppressed, and the height of the photoresist remaining after etching may be maintained.

In addition, according to the first exemplary embodiment, in the deposition process, no bias voltage is applied to the processing target object. As a result, according to the first exemplary embodiment, the protective layer including Si and C may be deposited without applying the bias voltage to the processing target object.

Other Exemplary Embodiments

Although the plasma etching method and the plasma etching apparatus according to the first exemplary embodiment have been described above, the disclosed technology is not limited thereto. Hereinafter, other exemplary embodiments will be described.

(Curing Process)

For example, after the protective layer is deposited on the photoresist, a curing process of curing the protective layer by plasma of a third processing gas including hydrogen ($H_2$) gas and an inert gas may be further performed in a state where a negative DC voltage is applied to a silicon containing upper electrode disposed to face the processing target object. The inert gas is, for example, argon (Ar) gas. When the curing process is performed, the etching process etches the base layer by the plasma of the second processing gas using the photoresist having the hardened protective layer deposited thereon, as a mask.

Here, a more detailed example of the curing process will be described. The process controller 50 of the plasma etching apparatus generates the plasma from the third processing gas including $H_2$ gas and an inert gas by introducing the third processing gas from the shower head 20 to the chamber 1 and supplying a high frequency power from the first high frequency power source 15. In addition, the process controller 50 applies a negative DC voltage having a predetermined polarity and magnitude from the variable DC power source 42 to the shower head 20 serving as the upper electrode during plasma generation. The process controller 50 may apply the negative DC voltage from the variable DC power source 42 such that a magnetic bias voltage Vdc of the facing surface of the shower head 20 facing the plasma processing space becomes deeper, in other words, the absolute value of Vdc on the facing surface of the shower head 20 increases to the extent that a predetermined sputter effect is obtained with respect to the facing surface of the shower head 20.

As a result, collision of ions against the facing surface of the shower head 20 is accelerated, which increases the falling quantity of silicon constituting the shower head 20 or the falling quantity of electron beams. For example, it is assumed that the third processing gas introduced from the shower head 20 to the chamber 1 includes Ar gas as an inert gas. In this case, Ar ions in the plasma collide against the facing surface of the shower head 20, thereby causing silicon constituting the shower head 20 to fall toward the protective layer on the photoresist of the processing target object. Then, silicon containing deposits are deposited on the surface of the photoresist including Si and C. As a result, the roughness of the surface of the photoresist may be improved and the plasma resistance of the photoresist may further be improved. As a result, according to the first exemplary embodiment, the roughening of a line formed by etching may be further suppressed, and, the height of the photoresist remaining after etching may also be maintained.

Hereinafter, the disclosed plasma etching method will be described in more detail using examples. However, the disclosed plasma etching method is not limited to the following examples.

Comparative Example 1

In Comparative Example 1, an etching process was performed on a processing target object using the following conditions.

(Etching Process)
Processing gas: $CH_4/CHF_3/O_2$=200 sccm/25 sccm/5 sccm
Pressure: 5.3 Pa (40 mTorr)
High frequency power from first high frequency power source: 500 W
High frequency power from second high frequency power source: 50 W
DC voltage to upper electrode: 0 V
Processing time: 40 seconds Example 1

In Example 1, a deposition process of depositing a protective layer on a processing target object was performed and, thereafter, an etching process was performed. The etching process was performed using the same conditions as Comparative Example 1. The deposition process was performed using the following conditions.

(Deposition Process)
Processing gas: $SiCl_4/He/H_2/CH_4$=50 sccm/200 sccm/100 sccm/20 sccm
Pressure: 1.3 Pa (10 mTorr)
High frequency power from first high frequency power source: 500 W
High frequency power from second high frequency power source: 0 W
DC voltage to upper electrode: 0 V
Processing time: 10 seconds Example 2

In Example 2, a deposition process of depositing a protective layer on a processing target object was performed and, then, a curing process of curing the protective layer was performed and, thereafter, an etching process was performed. The etching process was performed using the same conditions as Comparative Example 1. The deposition process was performed using the same conditions as Example 1. The curing process was performed using the following conditions (Curing Process)
Processing gas: $H_2$/Ar=100 sccm/800 sccm
Pressure: 6.5 Pa (50 mTorr)
High frequency power from first high frequency power source: 300 W
High frequency power from second high frequency power source: 0 W
DC voltage to upper electrode: −1 kV
Processing time: 20 seconds (Processing Results of Comparative Example 1 and Examples 1 and 2)

Figure 6:
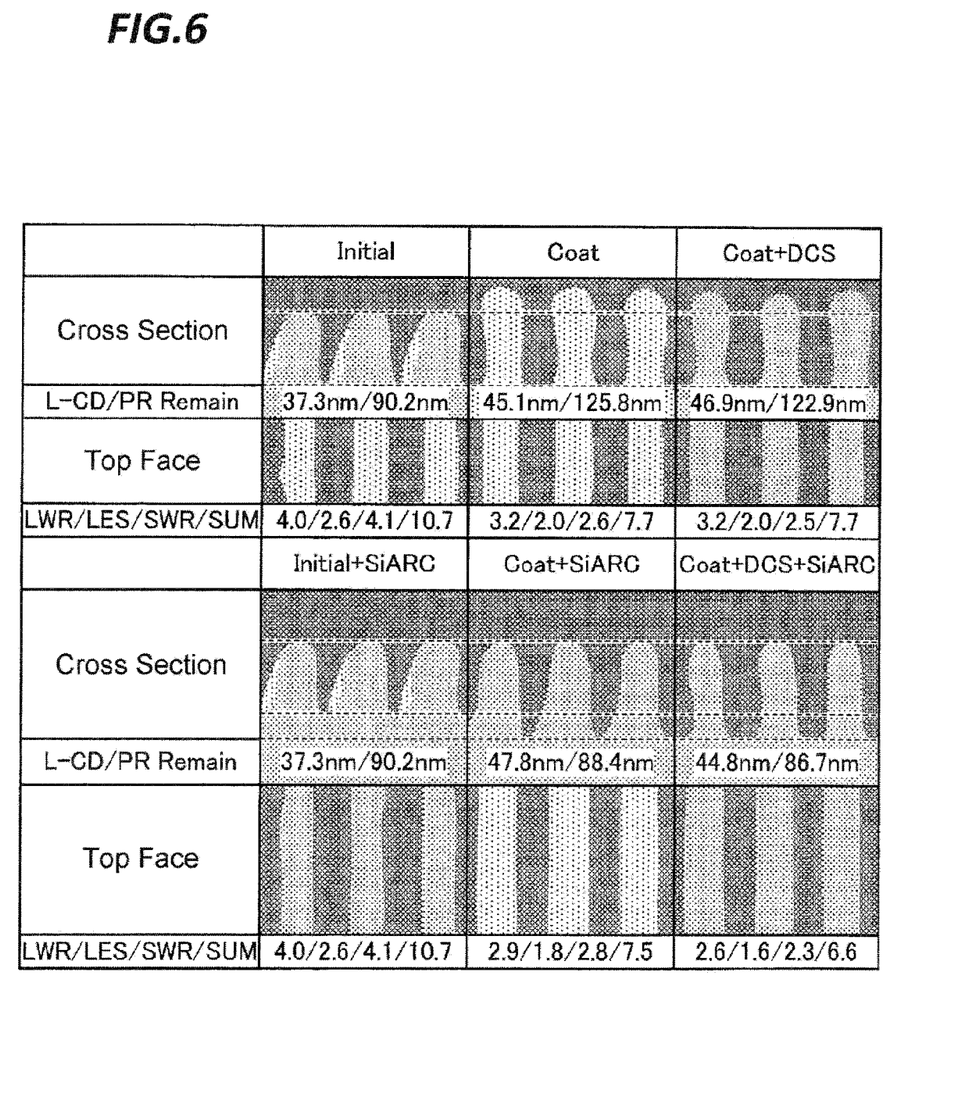
FIG. 6 is a view illustrating processing results of Comparative Example 1 and Examples 1 and 2.

FIG. 6 is a view illustrating processing results of Comparative Example 1 and Examples 1 and 2. FIG. 6 illustrates trace drawings of enlarged photographs of cross sections and top faces for processing target objects before a processing, a processing target objects after the etching process of Comparative Example 1, a processing target object after the deposition process of Example 1, the processing target object after the etching process of Example 1, a processing target object after the curing process of Example 2, and the processing target object after the etching process of Example 2.

In FIG. 6, "Initial" represents the processing target objects before a processing. "Initial+SiARC" represents the processing target object after the etching process of Comparative Example 1. "Coat" represents the processing target object after the deposition process of Example 1. "Coat+SiARC" represents the processing target object after the etching process of Example 1. "Coat+DCS" represents the processing target object after the curing process of Example 2. "Coat+DCS+SiARC" represents the processing target object after the etching process of Example 2.

In addition, FIG. 6 illustrates "L-CD" that is a line width of the photoresist (line) remaining after each process in Comparative Example 1 and Examples 1 and 2 and "PR Remain" that is the height of the photoresist remaining after each process. In addition, FIG. 6 illustrates values of line width roughness (LWR), line edge roughness (LER), and space width roughness (SWR) after each process in Comparative Example 1 and Examples 1 and 2 as well as "SUM" that is the sum of LWR, LER and SWR. In addition, each of LWR, LER, SWR and SUM represents the degree of non-uniformity of a line and the smaller value represents the smaller roughness.

As illustrated in FIG. 6, in Examples 1 and 2 in which the deposition process was performed, the width of the line, the height of the photoresist and the roughness of the line after etching were improved in either Example 1 or Example 2 as compared to Comparative Example 1 in which no deposition process was performed. That is, as compared to Comparative Example 1, the roughening of the line formed by etching was capable of being suppressed and the height of the photoresist remaining after etching was capable of being maintained in Examples 1 and 2.

In addition, in Example 2 in which the curing process was performed, the roughness of the line after etching was further improved as compared to Example 1 in which no curing process is performed.

Comparative Example 2

In terms of the deposition process of Example 1, the processing gas used in Comparative Example 2 and the flow rate thereof were $SiCl_4/He/H_2/CH_4=50$ sccm/200 sccm/0 sccm/20 sccm. The other conditions are equal to those in Example 1.

Example 3

In terms of the deposition process of Example 1, the processing gas used in Example 3 and the flow rate thereof were $SiCl_4/He/H_2/CH_4=50$ sccm/200 sccm/200 sccm/20 sccm. The other conditions are equal to those in Example 1.

(Processing Results of Comparative Example 2 and Examples 1 and 3)

Figure 7:
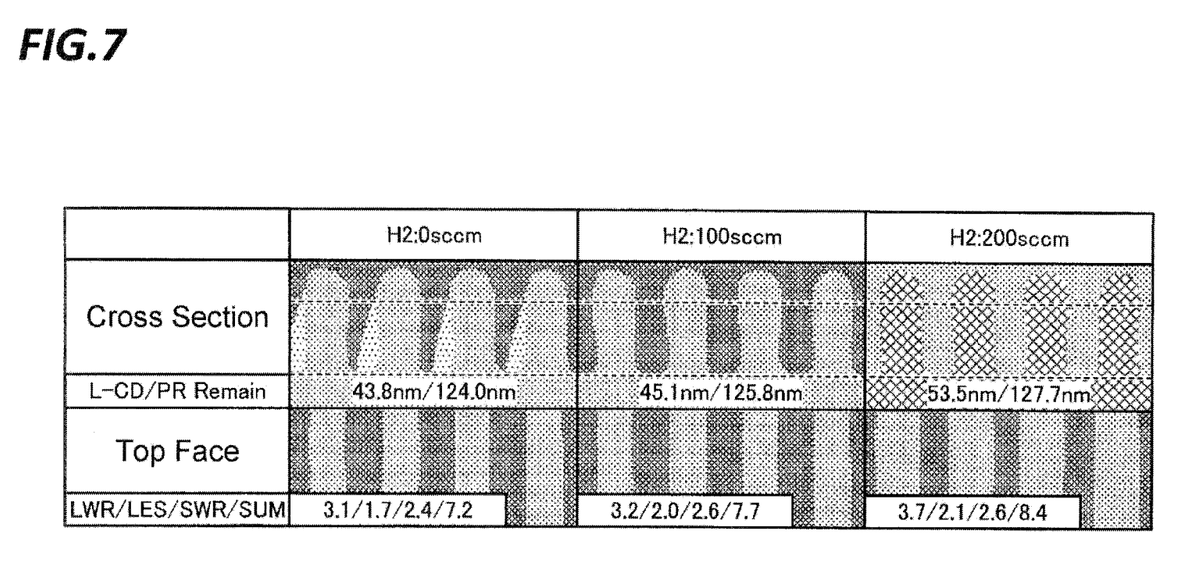
FIG. 7 is a view illustrating processing results of Comparative Example 2 and Examples 1 and 3.

FIG. 7 is a view illustrating processing results of Comparative Example 2 and Examples 1 and 3. FIG. 7 illustrates trace drawings of enlarged photographs of cross sections and top faces for a processing target object after the deposition process of Comparative Example 2, the processing target object after the deposition process of Example 1, and a processing target object after the deposition process of Example 3.

In FIG. 7, "H2:0 sccm" represents the processing target object after the deposition process of Comparative Example 2. "H2:100 sccm" represents the processing target object after the deposition process of Example 1. "H2:200 sccm" represents the processing target object after the deposition process of Example 3.

In addition, FIG. 7 illustrates "L-CD" that is a line width of the photoresist (line) remaining after each process in Comparative Example 2 and Examples 1 and 3 and "PR Remain" that is the height of the photoresist remaining after each process. In addition, FIG. 7 illustrates values of LWR, LER, and SWR after the deposition process of Comparative Example 2 and Examples 1 and 3 as well as "SUM" that is the sum of LWR, LER and SWR. In addition, each of LWR, LER, SWR and SUM represents the degree of non-uniformity of a line and the smaller value represents the smaller roughness.

As illustrated in FIG. 7, in Examples 1 and 3 in which the processing gas includes $H_2$, the width of the line and the height of the photoresist after the deposition process were improved in either Example 1 or Example 2 as compared to Comparative Example 2 in which the processing gas does not include $H_2$. In addition, in Examples 1 and 3 in which the processing gas includes $H_2$, the roughness of lines after the deposition process was maintained comparably to Comparative Example 2 in which the processing gas does not include $H_2$.

As described above, in Examples 1 and 3 in which the processing gas includes $H_2$, the height of the photoresist may be improved as compared to Comparative Example 2 in which the processing gas does not include $H_2$. In other words, even in a case where the etching process is further subsequently performed, in Examples 1 and 3 in which the processing gas includes $H_2$, clear etching is possible as compared to Comparative Example 2 in which the processing gas does not include $H_2$. As a result, in Examples 1 and 2, the roughening of the line formed by etching may be suppressed comparably to Comparative Example 2 and the height of the photoresist remaining after etching may be maintained at a higher value than that in Comparative Example 2.

Comparative Example 3

In terms of the deposition process of Example 1, the processing gas used in Comparative Example and the flow rate thereof were $SiCl_4/He/H_2/CH_4=50$ sccm/200 sccm/100 sccm/0 sccm. The other conditions are equal to those in Example 1.

Comparative Example 4

In terms of the deposition process of Example 1, the processing gas used in Comparative Example 4 and the flow rate thereof were $SiCl_4/He/H_2/CH_4=0$ sccm/200 sccm/100 sccm/50 sccm. The other conditions are equal to those in Example 1.

Example 4

In terms of the deposition process of Example 1, the processing gas used in Example 4 and the flow rate thereof were $SiCl_4/He/H_2/CH_4=20$ sccm/200 sccm/100 sccm/50 sccm. The other conditions are equal to those in Example 1.

(Processing Results of Comparative Examples 3 and 4 and Examples 1 and 4)

Figure 8:
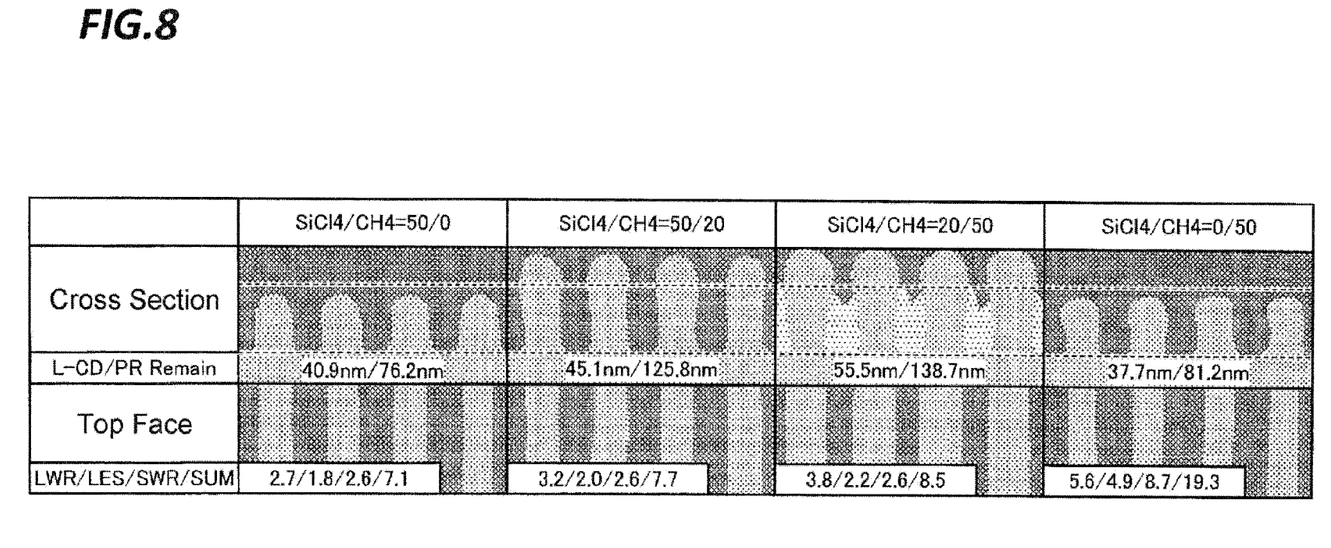
FIG. 8 is a view illustrating processing results of Comparative Examples 3 and 4 and Examples 1 and 4.
Figure 9:
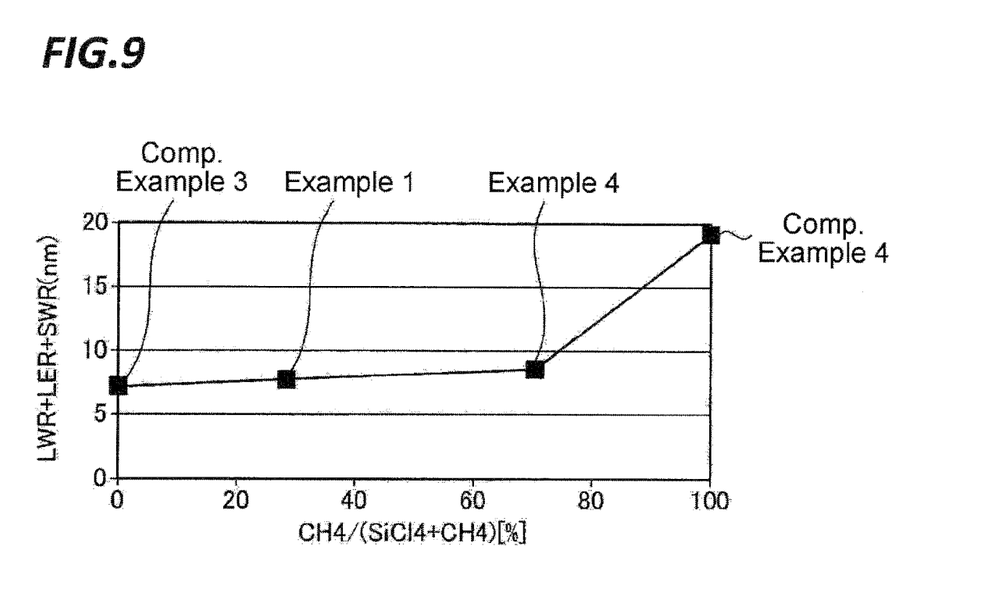
FIG. 9 is a view illustrating processing results of Comparative Examples 3 and 4 and Examples 1 and 4.
Figure 10:
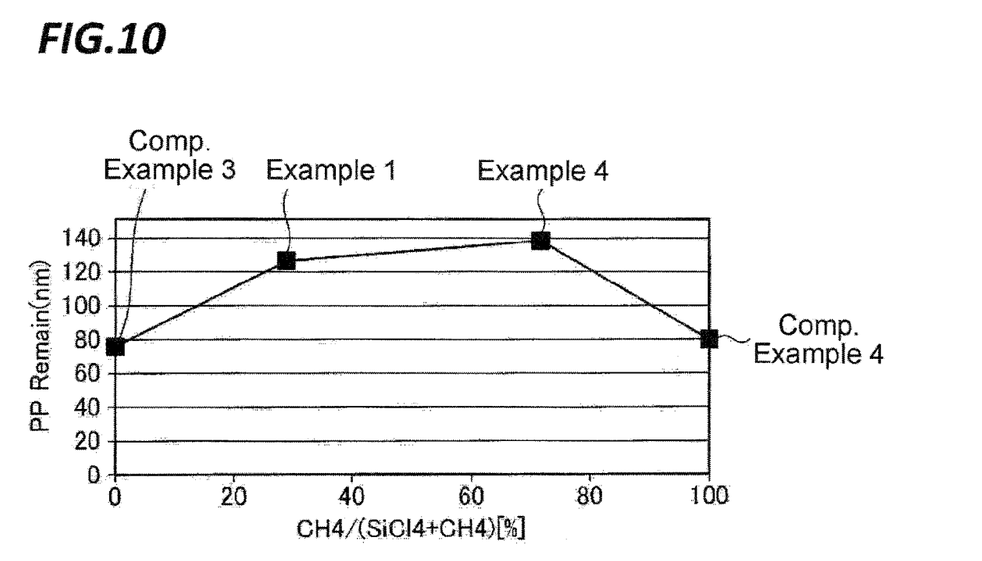
FIG. 10 is a view illustrating processing results of Comparative Examples 3 and 4 and Examples 1 and 4.

FIGS. 8 to 10 are views illustrating processing results of Comparative Examples 3 and 4 and Examples 1 and 4. FIG. 8 illustrates trace drawings of enlarged photographs of cross sections and top faces for a processing target object after the deposition process of Comparative Example 3, a processing target object after the deposition process of Comparative Example 4, the processing target object after the deposition process of Example 1, and a processing target object after the deposition process of Example 4.

In FIG. 8, "SiCl4/CH4=50/0" represents the processing target object after the deposition process of Comparative Example 3. "SiCl4/CH4=0/50" represents the processing target object after the deposition process of Comparative Example 4. "SiCl4/CH4=50/20" represents the processing target object after the deposition process of Example 1. "SiCl4/CH4=20/50" represents the processing target object after the deposition process of Example 4.

In addition, FIG. 8 illustrates "L-CD" that is a line width of photoresist (line) remaining after the deposition process of each of Comparative Examples 3 and 4 and Examples 1 and 4 and "PR Remain" that is the height of the photoresist remaining after the deposition process. In addition, FIG. 8 illustrates values of LWR, LER, and SWR after the deposition process of each of Comparative Examples 3 and 4 and Examples 1 and 4 as well as "SUM" that is the sum of LWR, LER and SWR. In addition, each of LWR, LER, SWR and SUM represents the degree of non-uniformity of a line and the smaller value represents the smaller roughness.

In addition, FIG. 9 illustrates a relationship between "SUM" (LWR+LER+SWR) after the deposition process in each of Comparative Examples 3 and 4 and Examples 1 and 4 and the ratio of the flow rate of $CH_4$ to the sum of the flow rate of $SiCl_4$ gas and the flow rate of $CH_4$ gas. In FIG. 9, the vertical axis represents "SUM" (LWR+LER+SWR) after the deposition process in each of Comparative Examples 3 and 4 and Examples 1 and 4 and the horizontal axis represents the ratio of the flow rate of $CH_4$ to the sum of the flow rate of SiCl4 gas and the flow rate of $CH_4$ gas.

In addition, FIG. 10 illustrates a relationship between "PR Remain" that is the height of the photoresist remaining after the deposition process in each of Comparative Examples 3 and 4 and Examples 1 and 4 and the ratio of the flow rate of $CH_4$ to the sum of the flow rate of $SiCl_4$ gas and the flow rate of $CH_4$ gas. In FIG. 10, the vertical axis represents "PR Remain" that is the height of the photoresist remaining after the deposition process in each of Comparative Examples 3 and 4 and Examples 1 and 4 and the horizontal axis represents the ratio of the flow rate of $CH_4$ to the sum of the flow rate of $SiCl_4$ gas and the flow rate of $CH_4$ gas. Hereinafter, the ratio of the flow rate of $CH_4$ to the sum of the flow rate of $SiCl_4$ gas and the flow rate of $CH_4$ gas is referred to as "$CH_4$ ratio."

As illustrated in FIGS. 8 and 9, in Examples 1 and 4 in which the $CH_4$ ratio is greater than 0% and 80% or less, the roughness of the line after the deposition process was improved in either Example 1 or 4 as compared to Comparative Example 4 in which the $CH_4$ ratio is greater than 80%. In addition, as illustrated in FIGS. 8 and 10, in Examples 1 and 4 in which the $CH_4$ ratio is greater than 0% and 80% or less, the height of the photoresist after the deposition process was improved in either Example 1 or 4 as compared to Comparative Example 3 in which the $CH_4$ ratio is 0 and Comparative Example 4 in which the $CH_4$ ratio is greater than 80%.

As described above, in Examples 1 and 4 in which the $CH_4$ ratio is greater than 0% and 80% or less, the roughening of the line after the deposition process may be suppressed and the height of the photoresist after the deposition process may be maintained at a higher value in either Example 1 or 4 as compared to Comparative Example 3 in which the $CH_4$ ratio is 0 and Comparative Example 4 in which the $CH_4$ ratio is greater than 80%. In other words, even in a case where the etching process is further subsequently performed, in Examples 1 and 4 in which the $CH_4$ ratio is greater than 0% and 80% or less, clear etching is possible as compared to Comparative Example 3 in which the $CH_4$ ratio is 0 and Comparative Example 4 in which the $CH_4$ ratio is greater than 80%. As a result, in Examples 1 and 4, the roughening of the line formed by etching may be suppressed and the height of the photoresist remaining after etching may be maintained at a higher value as compared to Comparative Examples 3 and 4.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A plasma etching method comprising:
depositing a protective layer including silicon and carbon on a photoresist of a processing target object by plasma of a first processing gas including silicon tetrachloride gas, methane gas, and hydrogen gas, the processing target object including a base layer and the photoresist having a predetermined pattern which are laminated in sequence; and
etching the base layer by plasma of a second processing gas using the photoresist including the protective layer deposited thereon, as a mask, the second processing gas being different from the first processing gas,
wherein, in the depositing of the protective layer including silicon and carbon on the photoresist, no bias voltage is applied to the processing target object.

2. The plasma etching method according to claim 1, further comprising, after the depositing of the protective layer on the photoresist:
curing the protective layer by plasma of a third processing gas including hydrogen gas and an inert gas in a state where a negative direct current (DC) voltage is applied to an upper electrode disposed to face the processing target object and containing silicon,
wherein the etching includes etching the base layer by plasma of the second processing gas using the photoresist including the protective layer deposited and cured thereon, as a mask.

3. The plasma etching method according to claim 1, wherein the second processing gas includes $CF_4$ gas, $CHF_3$ gas, and $O_2$ gas.

4. The plasma etching method according to claim 1, wherein a flow rate of $CH_4$ gas is 80% or less of a sum of a flow rate of $SiCl_4$ gas and the flow rate of $CH_4$ gas.

* * * * *